United States Patent [19]

Palmer, III

[11] Patent Number: 4,826,441
[45] Date of Patent: May 2, 1989

[54] TEST BOARD CONNECTORS AND METHOD FOR ATTACHING

[75] Inventor: Ransom C. Palmer, III, Bridgewater, N.J.

[73] Assignee: Micro Stamping Corporation, Maplewood, N.J.

[21] Appl. No.: 95,081

[22] Filed: Sep. 11, 1987

[51] Int. Cl.[4] .......................... H05K 1/00; H05K 3/30
[52] U.S. Cl. ....................................... 439/79; 29/837; 324/73 PC; 439/554; 439/557
[58] Field of Search ............ 29/834, 837; 324/73 PC, 324/158 F; 439/79, 329, 571, 572, 552, 554, 557, 567

[56] References Cited

U.S. PATENT DOCUMENTS 3,950,060  4/1976  Stipanuk et al. .................... 439/329
4,681,389  7/1987  Nakazawa et al. ................. 439/557

FOREIGN PATENT DOCUMENTS 2628617  1/1977  Fed. Rep. of Germany ...... 439/557

OTHER PUBLICATIONS

IBM Tech. Discl. Bulletin, vol. 28, No. 11, Apr. 1986, pp. 5121-5122.

Primary Examiner—Carl J. Arbes
Attorney, Agent, or Firm—Blum Kaplan

[57] ABSTRACT

For locking a test board connector to a printed wiring board, the connector includes a resilient member with a foot at its distal end and tabs positioned beneath the body of the connector. The foot and tabs extend in opposite directions. Lugs, which are molded to the bottom of the body of the connector serve to align the connector with an opening of the printed wiring board during attachment of the connector to the board. Both the tabs and resilient member are connected to the lugs.

11 Claims, 2 Drawing Sheets

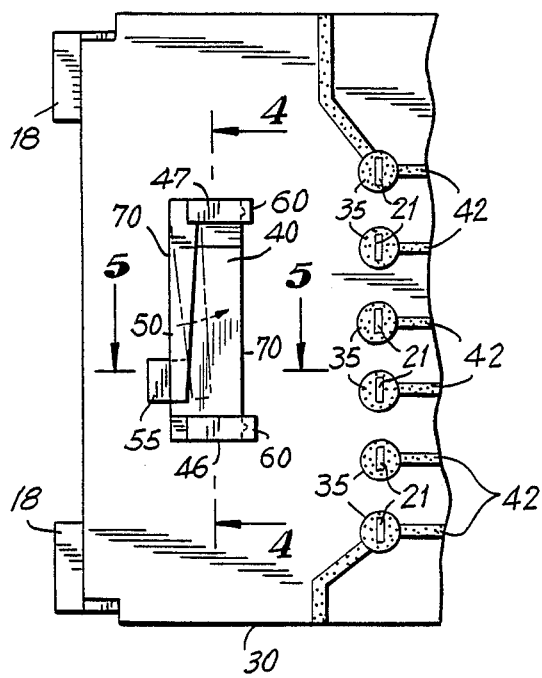
FIG. 3
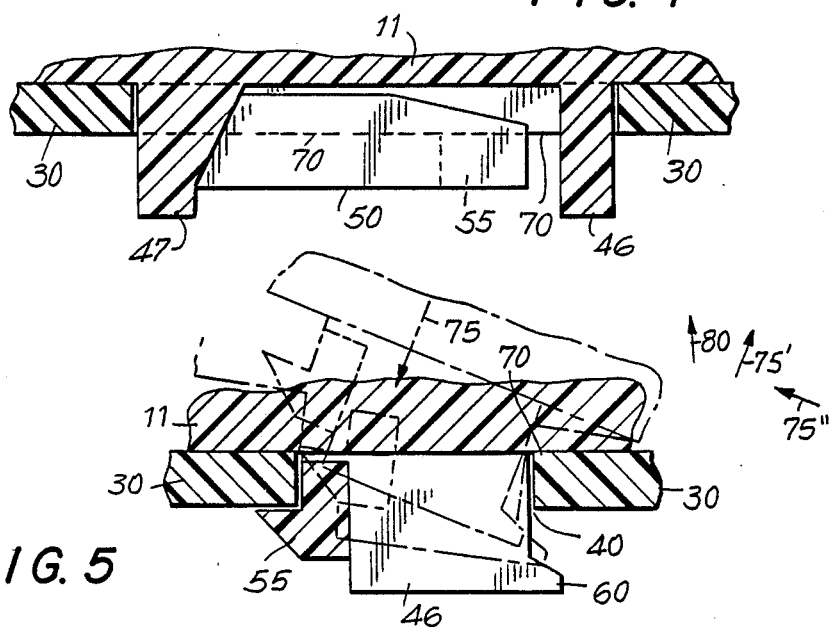
FIG. 4
FIG. 5

TEST BOARD CONNECTORS AND METHOD FOR ATTACHING

BACKGROUND OF THE INVENTION

This invention relates generally to a test board connector, and especially to attaching a test board connector to a printed wiring board.

A test board connector is electrically connected to printed wires/conductors of a printed wiring board (PWB) by soldering a plurality of leads of the test board connector to the printed conductors. One of the problems in soldering the leads of the test board connector to the printed conductors concerns maintaining the proper position of the leads on the PWB prior to soldering. In the event that the connector becomes dislodged from the PWB or is otherwise jockeyed about during assembly of the connector to the PWB but prior to soldering, the leads become misaligned relative to the printed conductors and therefore are soldered to either the wrong or no circuit. Consequently, it is essential that the test board connector once mounted to the PWB be maintained in its proper position relative to the printed conductors.

In the past, test board connectors have been attached to a PWB by first inserting a horseshoe-shaped ring which is connected to the bottom of the test board connector through an opening of the PWB. A stick of metal is then slid through that portion of the ring which extends beyond the bottom of the PWB. Finally, the piece of metal is soldered to the bottom of the PWB.

Alternatively, the test board connector has a pair of legs extending beneath the body of the connector which are inserted through an opening of the PWB. Attached to one of the legs is a resilient arm extending towards but not in contact with the other leg. A finger located at the distal end of the resilient arm has a beveled surface sloping outwardly. As the legs of the connector are pushed through the opening of the PWB, the finger engages the periphery of the opening thereby bending the resilient arm towards the center of the opening. By continuing to push the legs through the opening, the beveled surface allows the finger to slide against the periphery of the opening until the finger is beneath the bottom surface of the PWB. At this point, the resilient arm snaps back to its original position thereby pushing the finger outside the opening and directly beneath the bottom surface of the PWB. Consequently, upward mobility of the connector is inhibited by the finger. The finger, however, does not adequately inhibit upward mobility and thus does not always prevent misalignment of the leads relative to the printed conductors prior to soldering of the former to the latter.

SUMMARY OF THE INVENTION

In accordance with the invention, for attaching a test board connector to a PWB, the test board connector includes a resilient member having a foot at its distal end and a pair of tabs which together lock the test board connector to the PWB. The foot and pair of tabs extend in opposite directions and together are inserted through the opening and below the surface of the PWB.

Accordingly, it is an object of this invention to provide an improved test board connector and method of connecting the test board connector to the PWB which ensures that the test board connector remains secured to the PWB and thereby maintains the leads of the connector in proper alignment with the printed conductors of the PWB.

It is yet another object of the invention to provide a test board connector which is easily attached to the PWB.

It is yet another object of the invention to provide a test board connector which takes less time and is less costly to attach to the PWB than prior art test board conductors.

Still other objects and advantages of the invention will in part be obvious and will be in part be apparent from the specification.

The invention accordingly comprises several steps and the relation of one or more such steps with respect to each of the others and the device embodying features of construction, combinations of elements and arrangements of parts which are adapted to effect such steps, always exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 3 is a fragmented bottom plan view of FIG. 2;

FIG. 4 is a fragmented cross-section view of the test board connector and PWB taken along lines 4—4 of FIG. 3; and FIG. 5 is a fragmented cross-section view of the test board connector and PWB as the former is inserted into the latter taken along lines 5—5 of FIG. 3.

DESCRIPTION OF THE PREFERRED EMBODIMENTS

Figure 1:
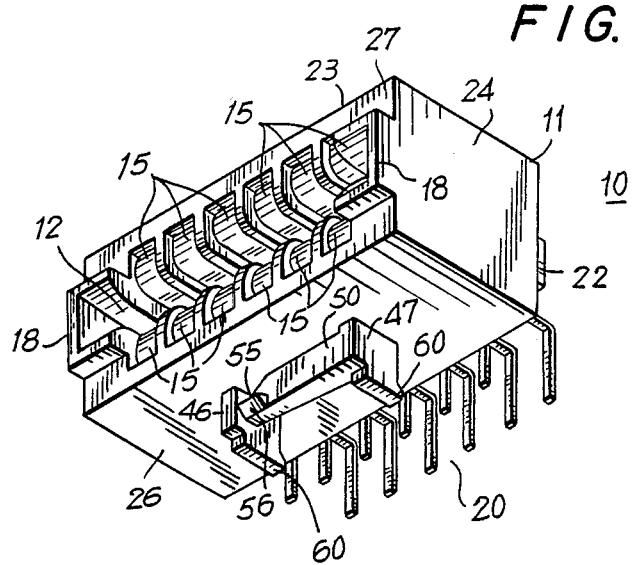
FIG. 1 is a rear perspective view of a test board connector in accordance with the invention.

Referring to FIG. 1, a test board connector 10 includes a body 11 having a cavity 12 and resembles an open ended rectangular box. Body 11 has a flat top surface 23, flat side surfaces 24, a flat front surface 25, a flat bottom surface 26 and a flat rear surface 27. Within cavity 12 are a plurality of electrical contacts 15. Two C-shaped guides 18 facing each other on opposite ends of rear surface 27 serve to guide an electrical male plug (not shown) of a diagnostic device within cavity 12 for connection to contacts 15.

Figure 2:
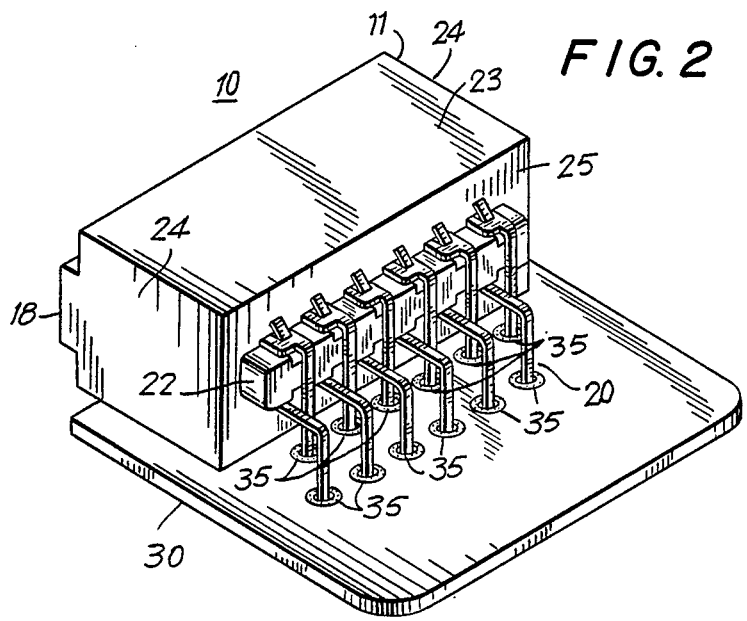
FIG. 2 is a front perspective view of the test board connector attached to a PWB.

As shown in FIG. 2, a plurality of flexible electrical leads 20 protrude from front surface 25 and form two rows separated by a ledge 22. Each of the leads is connected to one of the electrical contacts and forms a right angle elbow. Leads 20 extend through a plurality of openings 35 of a printed wiring board 30. As shown in FIG. 3, distal ends 21 of leads 20 are connected by, for example, solder to a corresponding plurality of conductors 42 printed onto the bottom surface of board 30. Board 30 also has an additional rectangular opening 40 bordered by a periphery 70.

Referring once again to FIG. 1, integrally connected to bottom surface 26 are two lugs 46 and 47 each of which has a substantially rectangular block shape. Integrally connected to lug 47 is a resilient member 50 which extends toward but does not contact lug 46. Lugs 46 and 47 and member 50 are substantially perpendicular to bottom surface 26. At the distal end of member 50 is a foot 55 connected at a substantially perpendicular angle to member 50 and having a beveled surface 56 sloping from member 50 toward bottom surface 26. A pair of tabs 60 connected at the distal ends of lugs 46 and 47 extend in a direction opposite to the direction of foot 55. Lugs 46 and 47 as well as tabs 60 are substantially perpendicular to member 50. Tabs 60 are positioned slightly further from bottom surface 26 than foot 55.

Referring now to FIGS. 3-5, connector 10 is attached to board 30 as follows: leads 20 are initially inserted through openings 35 of board 30 with distal ends 21 of leads 20 extending beneath the bottom of board 30. Tabs 60 are then guided through opening 40 of board 30 at a slanted angle relative to the top surface of board 30, that is, at an angle of less than 90° relative to the top surface of board 30. As best seen in FIG. 5, tabs 60 are inserted through opening 40 and underneath board 30 at this slanted angle relative to board 30 until lugs 46 and 47 come into contact with periphery 70 of opening 40 and tabs 60 are beneath board 30 and beyond opening 40. Then, as shown by the dashed lines of FIGS. 3 and 5, connector 10 is rocked in a downwardly direction, as denoted by arrow 75, to force resilient member 50 to bend inwardly upon foot 55 engaging periphery 70 of opening 40. Due to beveled surface 56 of foot 55, as the downwardly rocking motion is continued, foot 55 slides against periphery 70 until foot 55 is beneath board 30 at which time resilient member 50 snaps back to its original unbent position.

Lugs 46 and 47 serve to properly align connector 10 relative to opening 40 and also serve to prevent lateral movement of connector 10 relative to board 30 following attachment of connector 10 to board 30.

Once assembled as described above, foot 55 in combination with tabs 60 prevent connector 10 from becoming dislodged/jarred out of opening 40. More particularly, foot 55 serves as a latch to prevent connector 10 from being jarred out of opening 40 by forces which are directed perpendicular to board 30 as denoted by arrow 80 or by forces opposite to the rocking motion 75 denoted by arrow 75'. Additionally, tabs 60 serve as stops to prevent connector 10 from being jarred out of opening 40 by forces perpendicular to arrow 75 denoted by arrow 75". Accordingly, foot 40 cooperates with tabs 60 to ensure that connector 10 remains properly positioned relative to board 30 for soldering of leads 20 to conductors 42.

Body 11 is approximately 3 cm in width by 1.2 cm in height and 1.3 cm in depth. Lugs 46 and 47 are approximately 2 cm by 3 cm. Resilient member 50 is approximately 1 cm in length and 2 cm in width with foot 55 protruding approximately 1 cm from member 50. Lugs 60 are approximately 1 cm in length and width. Board 30 is typically an insulated substrate. Body 11, lugs 46 and 47, member 50, foot 55 and tabs 60 are typically molded as one piece from, for example, plastic material.

As now can be appreciated, the invention prevents connector 10 from being jarred out of position for soldering of leads 20 to conductors 42 as compared to the prior art. Furthermore, the invention is far less expensive and easier to assemble since there is no need to provide, for example, horseshoe-shaped rings, sticks of metal and soldering of sticks of metal to a printed wiring board as in the prior art. Still further, the invention takes far less time to assemble since there are only two steps, namely, inserting leads 20 into holes 35 and pushing the assembly of lugs 46 and 47, resilient member 50, foot 55, and tab 60 through opening 40 of board 30 compared to the numerous steps of the prior art disclosed heretofore.

It will thus be seen that the objects set forth above, and those made apparent from the preceeding description, are efficiently obtained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all the generic and specific features of the invention herein described, and all statements of the scope of the invention which, as a matter of language, might be said to fall therebetween.

What is claimed is:

1. For attaching a test board connector to a printed wiring board having a bottom surface, the test board connector comprises:
   latch means adapted to inhibit removal of the connector from the board; and
   tab means adapted to cooperate with said latch means for locking the connector to the board;
   wherein at least portions of said latch means and said tab means are operable for disposal beneath the bottom surface of the board.

2. The connector of claim 1, wherein the latch means includes a foot located at the distal end of the latch means.

3. The connector of claim 2, wherein the foot and tab means extend in opposite directions.

4. For attaching a test board connector to a printed wiring board, the test board connector comprises:
   latch means adapted to inhibit removal of the connector from the board, said latch means including a foot located at the distal end of the latch means and a resilient member extending substantially perpendicularly to the direction of the foot; and
   tab means adapted to cooperate with said latch means for locking the connector to the board;
   wherein the foot and tab means extend in opposite directions.

5. The connector of claim 4, further comprising lug means operable for extending through an opening of the board and adapted to prevent lateral movement of the connector relative to the board.

6. The connector of claim 5, wherein the latch means and tab means are connected to the lug means.

7. The connector of claim 6, further comprising a body having a bottom and adapted to receive a male plug and from which leads extend, said leads adapted to be inserted into said board; and wherein the lugs are integral with and extend in a direction substantially perpendicular to the bottom of said body.

8. The connector of claim 7, wherein the tab means are positioned further from the body of the connector than the foot.

9. The connector of claim 1, further comprising a body; said latch means and tab means being located beneath the body.

10. A test board connector including a body adapted to receive a male plug and having leads adapted to be inserted through openings of a printed wiring board, said connector comprising:
    lugs integrally connected to and extending beneath the body in a direction substantially perpendicular thereto;

latch means connected at its proximal end to one of the lugs and including a resilient member and a foot; said foot connected to the distal end of and extending substantially perpendicular to the resilient member; and tab means connected to the lugs and wherein said tab means and foot extend in opposite directions.

11. A method for attaching a test board connector to a printed wiring board wherein said connector includes a body, electrical leads protruding from said body, lugs attached to and located beneath the body, latch means connected to the lugs and having a resilient member and a foot connected to the distal end of the resilient member, and tab means connected to the lugs and extending in a direction opposite to the foot; said method comprising:

inserting the leads of the connector through openings of the board;

guiding the tab means through an additional opening of the board at an angle less than 90° to the board, until the lugs come into contact with the periphery of the additional opening and the tabs are beneath the board and beyond the additional opening;

rocking the body of the connector in a downwardly direction to force the resilient member of the latch means to bend upon the foot coming into contact with the periphery of the additional opening; and continuing the same rocking motion until the foot is beneath the board and thereby snaps the resilient member back to its original unbent position.

* * * * *